United States Patent [19]

Pfeiffer

[11] 4,423,305
[45] Dec. 27, 1983

[54] METHOD AND APPARATUS FOR CONTROLLING ALIGNMENT OF AN ELECTRON BEAM OF A VARIABLE SHAPE

[75] Inventor: Hans C. Pfeiffer, Ridgefield, Conn.

[73] Assignee: International Business Machines Corporation, Armonk, N.Y.

[21] Appl. No.: 288,636

[22] Filed: Jul. 30, 1981

[51] Int. Cl.³ .............................................. B23K 15/00
[52] U.S. Cl. ...................... 219/121 EU; 219/121 ER; 219/121 EW
[58] Field of Search .................. 219/121 ER, 121 ES, 219/121 EU, 121 EW, 121 EB, 121 EM

[56] References Cited

U.S. PATENT DOCUMENTS

| | | | |
|---|---|---|---|
| 3,644,700 | 2/1972 | Kruppa et al. | 219/121 ER X |
| 3,894,271 | 7/1975 | Pfeiffer et al. | 315/384 |
| 3,894,271 | 7/1975 | Pfeiffer et al. | 219/121 ER X |
| 4,243,866 | 1/1981 | Pfeiffer et al. | 219/121 ER |

OTHER PUBLICATIONS

J. Vac. Sci. Technol., vol. 12, No. 6, Nov./Dec. 1975, "Automatic Stabilization of an Electron Probe Forming System", S. Doran et al., pp. 1174–1176.

*Primary Examiner*—C. L. Albritton
*Attorney, Agent, or Firm*—Frank C. Leach, Jr.

[57] ABSTRACT

An electron beam, which is applied along an axis from a source to a target, is aligned along the axis by deflecting the beam off the axis to a reference location. At the reference location, the source image of the electron beam is centered on a sensing plate through shifting the beam by an alignment yoke until the sensed current is a maximum through correction signals that are supplied to the alignment yoke. These correction signals are continuously applied to the alignment yoke when the electron beam is returned from the reference location to the position in which it is applied to the target.

18 Claims, 7 Drawing Figures

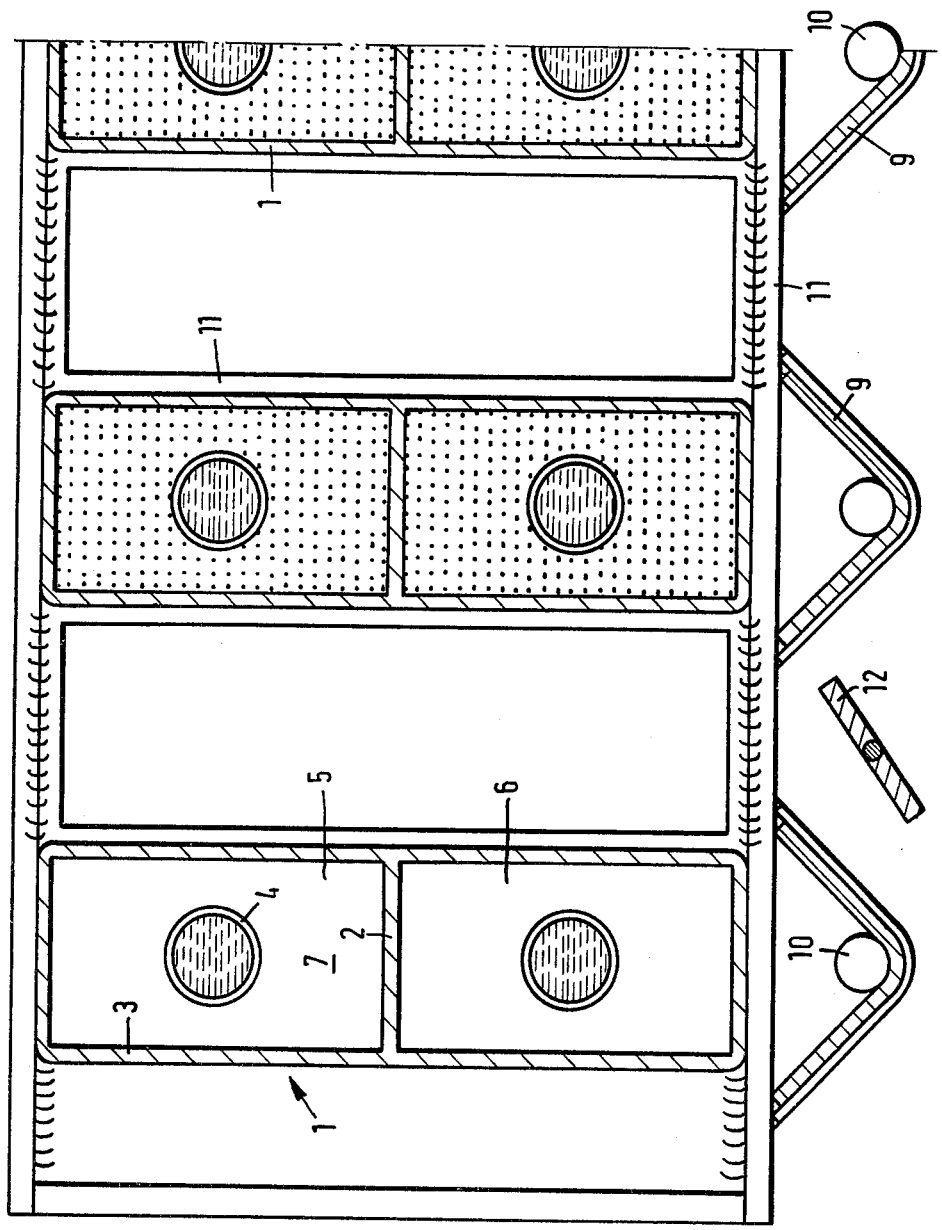

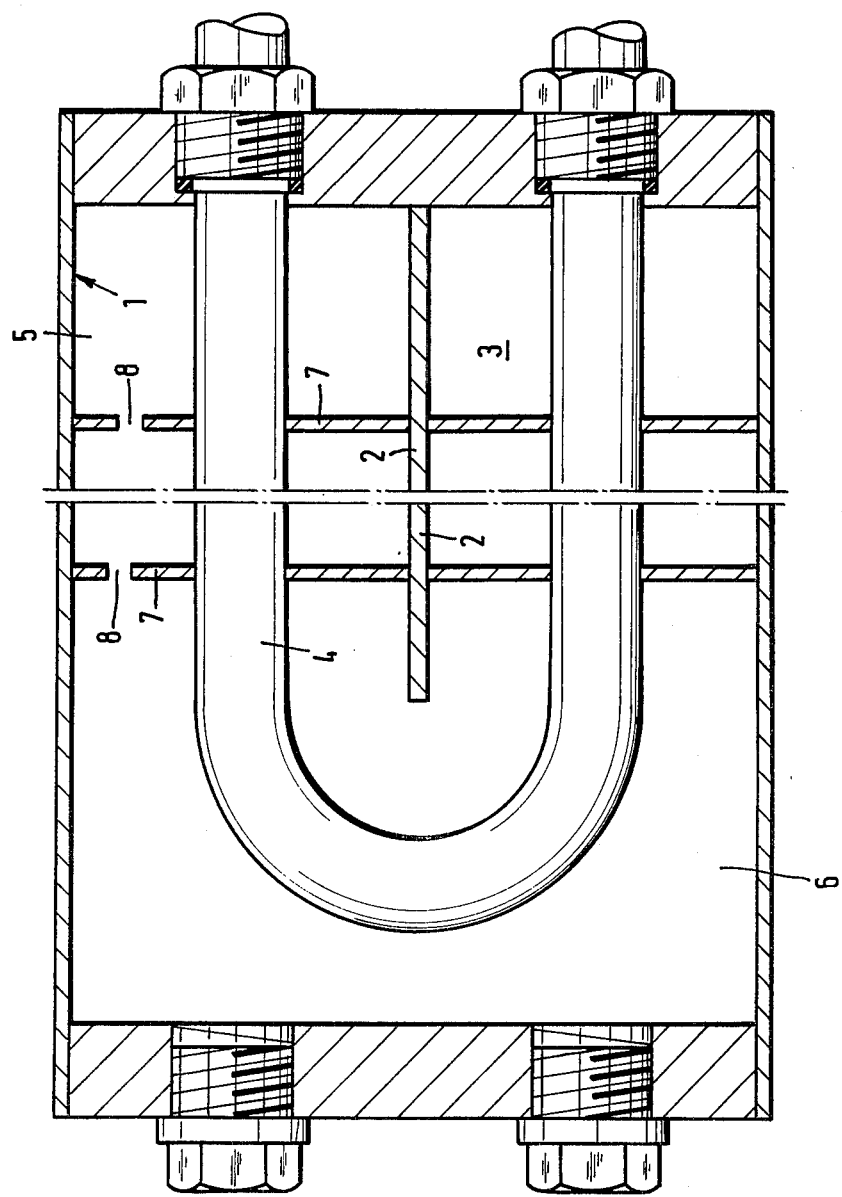

METHOD AND APPARATUS FOR CONTROLLING ALIGNMENT OF AN ELECTRON BEAM OF A VARIABLE SHAPE

DESCRIPTION

1. Technical Field

This invention relates to an apparatus for controlling the alignment of a beam of charged particles of a variable shape.

2. Background Art

In U.S. Pat. No. 4,243,866 to Pfeiffer et al, there is shown a method and apparatus for forming a variable size electron beam. This enables various size areas of the target to have the electron beam applied thereto to form a desired configuration in the target. For example, the target may be a semiconductor wafer in which it is desired to form integrated circuits with the pattern areas being formed by the use of resist.

The apparatus of the aforesaid Pfeiffer et al patent uses a circular aperture to limit the current density distribution of the electron beam. Thus, the diameter of this aperture must be sized in accordance with the half width of the Gaussian current density distribution of the image of the source of the electron beam to insure that the Gaussian current density distribution is properly truncated to limit the aberrations in the projection lens.

It is necessary that the source image by properly centered with respect to the circular aperture of the aforesaid Pfeiffer et al patent and that it remain stationary during the exposure process. The apparatus of the aforesaid Pfeiffer et al patent utilized an arrangement to dispose the source image so that it would be at a position relative to the shaping deflection plates to not be affected by deflection of the electron beam by the shaping deflection plates to produce the variable shaped spot of the electron beam at the target.

While the apparatus of the aforesaid Pfeiffer et al patent functions satisfactory, it has been found that frequent and delicate adjustments such as several times a day, for example, of all shaping signals for producing deflection of the beam are necessary to maintain adequate image quality. The drift produced by the various components causes undesirable, and sometimes unacceptable, deterioration of the source image if frequent and delicate adjustments of all of the shaping signals are not accomplished. This includes the source image not being at the position in which it is unaffected by the deflection of the electron beam.

Another cause of the source image deterioration is due to positional and size changes of the filament of the electron gun. This filament, which has a hairpin shape, changes its configuration during a normal burn cycle so as to alter both its position and size. Therefore, this also has an effect on the location of the source image in addition to the shaping signals.

Accordingly, while the apparatus of the aforesaid Pfeiffer et al patent has increased the throughput in comparison with electron beam apparatuses in which variable shape spots were not available, this necessity to adjust the shaping signals several times a day reduces the efficiency of the apparatus of the aforesaid Pfeiffer et al patent.

If the delicate adjustments of the shaping signals were not made several times daily, then current density variation of the variably shaped electron beam at the target would occur as a result of source image movement at the circular aperture. This would significantly affect the quality of the shaped beam so as to cause the semiconductor wafer, which is the target, to have the resist developed unevenly.

One means of reducing the frequency of adjustment of the shaping signals is to reduce the current density. However, this reduction of the current density reduces the throughput significantly. For example, when the target is a semiconductor wafer having resist exposed by the electron beam, a reduction of fifty percent in the current density would cause doubling of the time necessary to expose the resist used to form the pattern areas in the semiconductor wafer.

The apparatus of the present invention is an improvement of the apparatus of the aforesaid Pfeiffer et al patent in that it is not necessary to make adjustments of the shaping signals several times a day. Thus, the apparatus of the present invention requires only a daily check, which could be made at the start of each day of operation, of the spot with adjustment being required every several days or weeks to obtain the desired source image.

The present invention also does not require any reduction in current density. Thus, a relatively high current density such as 50 amps/cm$^2$, for example, may be used.

SUMMARY OF THE INVENTION

The apparatus of the present invention senses the current density at a reference location away from the axis along which the beam is applied from the electron source to the target. At this reference location to which the beam is moved at selected times, the beam is shifted incrementally and alternately in orthogonal directions by an alignment yoke, which is disposed along the axis of the beam from the source to the target, receiving signals from a current sensing arrangement until the maximum current is produced at the reference location. These correction signals are used with the alignment yoke to position the beam, when it is disposed on the axis from the source to the target, so that the beam is properly centered to minimize aberrations in the projection lens. The size of the source image is selected so that the aberrations are contained within the allowable tolerances.

Therefore, it is not necessary to utilize a limiting circular aperture of the size required in the aforesaid Pfeiffer et al patent to control the diameter of the source image and the aberrations in the projection lens. Thus, the apparatus of the present invention does not require an on-axis limiting aperture of the size employed in the apparatus of the aforesaid Pfeiffer et al patent.

While the apparatus of the present invention has an on-axis limiting circular aperture through which the beam passes, its diameter is large enough that it does not substantially affect the current density distribution of the source image in the plane of the means having the aperture due to shifting of the source image relative to the axis of the beam when the beam is applied along the axis to the target. Thus, because of aligning the beam off its axis at selected times so that the beam remains centered to avoid the necessity of adjustments of the shaping signals several times daily as in the apparatus of the aforesaid Pfeiffer et al patent, it is not necessary to have the on-axis aperture of a small enough diameter to substantially affect the current density distribution of the source image in the plane of the means having the aperture as in the aforesaid Pfeiffer et al patent.

An object of this invention is to provide an apparatus for aligning an electron beam of a variable shape.

Another object of this invention is to provide an electron beam apparatus that is not sensitive to small movements of the source image.

The foregoing and other objects, features, and advantages of the invention will be apparent from the following more particular description of a preferred embodiment of the invention as illustrated in the accompanying drawings.

BRIEF DESCRIPTION OF THE DRAWINGS

In the drawings:

FIG. 3 is a schematic view, similar to FIG. 1, showing the trace of the aperture imaging.

FIG. 4 is a schematic and block diagram of the arrangement for aligning the beam off its axis.

FIG. 5 is a curve disclosing the Gaussian current density distribution of beam crossover (source image).

FIG. 6 is a schematic view showing shifting of the Gaussian current density distribution of FIG. 5 relative to an aperture having a diameter of substantially the half width of the Gaussian current density distribution.

FIG. 7 is a schematic view showing shifting of the Gaussian current density distribution of FIG. 5 relative to an aperture having a diameter substantially larger than the half width of the Gaussian current density distribution of FIG. 5.

DETAILED DESCRIPTION OF PREFERRED EMBODIMENT

Figure 1B:
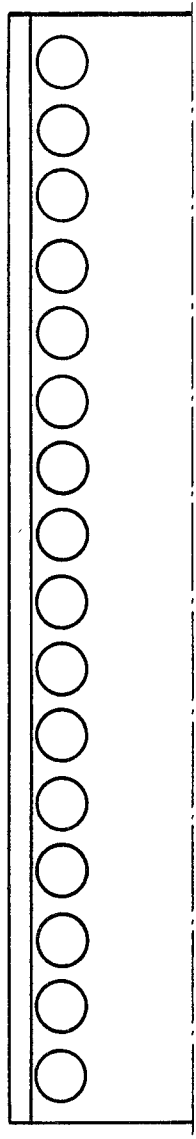
FIG. 1 is a schematic view of an electron beam apparatus having the beam aligned by the present invention and showing a linked-beam trace when there is no deflection to form a variable size beam or to sense the current of the source image of the beam.
Figure 1A:
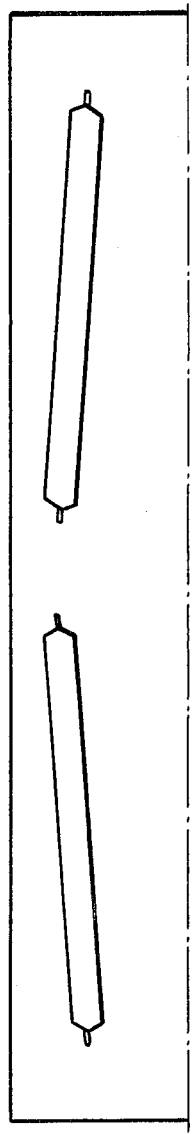

Referring to the drawings and particularly FIG. 1, there is shown a source 10, which is a filament of charged particles, preferably electrons, directing a beam of electrons along an axis 11 of an electron beam column towards a target 12. The target 12 may be a semiconductor wafer, for example, having a resist thereon in which a pattern is to be formed by the electron beam produced from the electron source 10.

Figure 2:
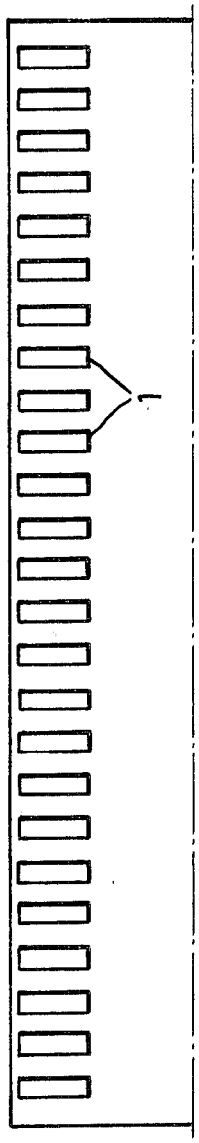
FIG. 2 is a schematic view, similar to FIG. 1, showing the trace of the source imaging.

As more particularly shown and described in the aforesaid Pfeiffer et al patent, the beam from the electron source 10 is shaped into a variable rectangular spot for application to the target 12 by first passing the beam through an aperture 14, which is preferably square shaped, in a plate 15. The trace of the imaging of the electron source 10 from a point of the source 10 on the left side of the axis 11 is indicated in FIG. 2. From a point at the right edge of the first aperture 14, the trace of the image of the first aperture 14 and the trace of the composite image formed by the first aperture 14 and a second aperture 16, which is preferably square shaped, in a plate 17 is shown in FIG. 3. From FIGS. 2 and 3, it can be observed that the trace of the imaging of the source 10 overlies the aperture image trace in certain portions of FIG. 1.

After passing through the first aperture 14 (see FIG. 1) in the plate 15 to be shaped as a square, the beam passes through a condenser lens 18, which may suitably be a magnetic lens of conventional design in the electron beam art. The condenser lens 18 focuses an image 19 of the aperture 14 in the plane of the aperture 16.

The condenser lens 18 also functions to focus an image 20 of the electron source 10 at a point along the axis 11 and in the center of deflection means, which comprises four electrostatic plates (two shown at 21 and 22). The electrostatic plates 21 and 22 deflect the focused image 19 of the first square aperture 14 with respect to the second square aperture 16 in one of the two orthogonal (X and Y) directions during the beam shaping operation as more particularly shown and described in the aforesaid Pfeiffer et al patent. The deflection means includes a second pair of plates to deflect the beam laterally in the other of the orthogonal (X and Y) directions during the beam shaping operation.

In the manner more particularly shown and described in the aforesaid Pfeiffer et al patent, the virtual center of deflection produced by the electrostatic deflection plates (two shown at 21 and 22) is maintained in coincidence with the plane at which the source image 20 is disposed by the condenser lens 18. Thus, deflection of the image 19 of the first aperture 14 to shape the beam does not have any effect on the focused source image 20.

The focal length of the condenser lens 18 is determined primarily to focus the aperture image 19 in the plane of the aperture 16. This is why the focusing of the source image 20 does not necessarily occur at the virtual center of deflection of the deflection means.

To provide the most efficient and uniform illumination for the beam, i.e., constant current density, a second condenser lens 23, which may be any standard magentic condenser lens within which the second aperture plate 17 is disposed, images the source image 20 into the entrance pupil of a first demagnification lens 24. For the source image 20 to be properly imaged into the entrance pupil of the first demagnification lens 24 by the second condenser lens 23, it is necessary for the source image 20 to remain stationary during any deflection of the focused aperture image 19 in the X or Y direction.

The second condenser lens 23 causes a source image 25 to be close to the front focal plane of the first demagnification lens 24. This produces a magnified image 26 of the source 10 in the plane of a circular aperture 27 in a blanking plate 28. The location of the image 26 of the source 10 is dependent upon the position of the source image 20. The diameter of the aperture 27 in the plate 28 is at least twice as large as the half width of the Gaussian current density distribution of the image 26 (beam crossover) from the source 10. This prevents any small movements of the image 26 from causing changes in current density in the plane of the target 12.

As shown in FIG. 5, the half width is the size of the Gaussian current density distribution of the beam crossover from the source 10 at fifty percent of the maximum current density distribution and is identified by W. When utilized with an aperture A (see FIG. 6) of substantially the same diameter as the half width W (see FIG. 5), any movement of the beam with respect to the aperture A, as shown in FIG. 6, would substantially change the current passing through the aperture A. However, if an aperture B is substantially larger than the half width as shown in FIG. 7, then slight shifting of the beam does not have any effect on the current passing through the aperture B.

This relationship of the diameter of the aperture 27 (see FIG. 1) being at least twice as large as the half width of the Gaussian current density distribution of the source image 26 is controlled through properly scaling the size of the electron source 10 so that the diameter of the crossover of the source 10 determines the diameter of the beam rather than the diameter of the aperture 27. Thus, the aperture 27 does not have to limit the beam diameter in a projection lens 29.

The apparatus of the present invention includes an alignment yoke 30, which has a pair of orthogonal coils in the same manner as more particularly shown and described in U.S. Pat. No. 3,894,271 to Pfeiffer et al. The alignment yoke 30 receives correction signals from an alignment servo 33 (see FIG. 4) in the manner shown and described in the aforesaid U.S. Pat. No. 3,894,271 to Pfeiffer et al.

After the beam leaves the second condenser lens 23, it passes through the alignment yoke 30 and then between a pair of blanking plates 34, which determine when the beam is applied to the target 12 (see FIG. 1) and when the beam is blanked. The beam is blanked by being deflected to the blanking plate 28; it passes through the first demagnification lens 24 so that the source image 25 is magnified.

The blanking plates 34 are capable of moving the source image 25 four to five times the diameter of the beam so that a relatively large diameter of the circular aperture 27 in the blanking plate 28 does not prevent blanking of the beam when desired as discussed in more detail in U.S. Pat. No. 3,644,700 to Kruppa et al. When the blanking plates 34, which are a pair of electrostatic deflectiom plates, move the beam away from the aperture 27 and into contact with the blanking plate 28, the beam cannot strike the target 12.

As discussed in the aforesaid U.S. Pat. No. 3,894,271 to Pfeiffer et al, the beam moves in an A cycle, a B cycle, and a C cycle with the sequence beginning again with the A cycle after each C cycle. The beam is blanked during some or all of the A, B, and C cycles depending upon the particular operation that is being accomplished. All of these various sequences in which none, one, two, or all of the A, B, and C cycles is blanked are controlled by cooperation between a computer (not shown) and an interface (not shown) as more particularly shown and described in the aforesaid U.S. Pat. No. 3,894,271 to Pfeiffer et al.

During exposure of a pattern of resist on a semiconductor wafer, which is the target 12, the exposure of the resist occurs during the B cycle. During the C cycle, the target 12, which is mounted on a table, is moved by movement of the table to position another area of the target 12 at the position in which the beam may be applied thereto.

It is during this latter C cycle when the target 12, which is mounted on the table, is being moved by movement of the table that the alignment servo 33 (see FIG. 4) is operable. During this time, the beam is directed by the alignment yoke 30 into a second circular aperture 35, which has a diameter equal to the half width of the current density distribution of the source image 26 of the beam, in the blanking plate 28.

A sensing plate 36 is positioned just beneath the blanking plate 28 and spaced therefrom by a thin disc 37 of mica or other suitable insulating material. The disc 37 is very thin to avoid any charging problems. The sensing plate 36 has a central circular aperture 38, which is in alignment with the circular aperture 27 in the blanking plate 28 and larger than the aperture 27 so that the sensing plate 36 will not interfere with the normal operation of the beam.

When it is desired to position the beam over the aperture 35 in the blanking plate 28, fixed offsets in two orthogonal directions are supplied as signals to the alignment yoke 30. These fixed offsets are switched in during alignment and supplied from a DC offset generator 39 of the alignment servo 33 to a yoke driver 40, which positions the orthogonal coils of the alignment yoke 30.

When the beam is deflected to the aperture 35 in the blanking plate 28 and this occurs only during C cycles are more particularly described in the aforesaid U.S. Pat. No. 3,894,271 to Pfeiffer et al, the current is collected by the sensing plate 36 with the maximum current being when the beam is aligned on the axis 11. This is because a beam misalignment on the axis 11 at the aperture 27 of the blanking plate 28 results in an equivalent misalignment at the sensing aperture 35 in the blanking plate 28.

Because the circular aperture 35 has a diameter equal to the half width of the Gaussian current density distribution of the source image 26 of the beam, any movement of the beam from its alignment on the axis 11 results in a change in the current collected by the sensing plate 36. Thus, the maximum current can be collected by the sensing plate 36 only when the beam is aligned on the axis 11 since this is the only time that the Gaussian current density distribution of the source image 26 passes a maximum current through the aperture 35.

This can be ascertained from FIG. 6 wherein any shift of the Gaussian current density distribution results in a reduction of the current passing through the aperture A. The aperture A would correspond to the sensing aperture 35 (see FIG. 4) in the blanking plate 28.

The current, which is monitored by the sensing plate 36, is provided as a signal to an error detector 41 of the alignment servo 33. The error detector 41 is controlled by timing logic 42 with the timing logic 42 being controlled by the computer (not shown) through the interface (not shown) as shown and described in the aforesaid U.S. Pat. No. 3,894,271 to Pfeiffer et al.

The error signal from the error detector 41 is supplied to correction circuits 43, which generate correction signals to the yoke driver 40 in accordance with the output from the error detector 41. As previously mentioned, the yoke driver 40 receives the offset signals from the offset generator 39 with the offset generator 39 being controlled by the timing logic 42 to provide the fixed DC offset voltages, which cause the beam to be positioned by the blanking plates 34 over the aperture 35 in the sensing plate 28.

The yoke driver 40 also receives an input from a manual alignment potentiometer 44 of the alignment servo 33. The manual alignment potentiometer 44 is adjusted manually at the time of set up of the apparatus for producing the electron beam from the source 10 (see FIG. 1) so that the maximum current of the beam through the sensing aperture 35 (see FIG. 4) corresponds to a centered source image in the projection lens 29 (see FIG. 1) when the beam is passing through the aperture 27 in the blanking plate 28.

Therefore, by utilizing the output of the correction circuits 43 (see FIG. 4) in accordance with the input to the correction circuit 43 from the error detector 41, the beam is aligned off the axis 11 so as to be aligned along the axis 11 when returned thereto. This alignment occurs during each of the C cycles of the sequences of the A cycle, B cycle, and C cycle in which the target 12 (see FIG. 1) is subjected to the beam.

It should be understood that the correction signals to the yoke driver 40 (see FIG. 4) from the correction circuits 43 are carried out by moving the beam in small increments alternately in the two orthogonal (X and Y) directions. This continues until the sensing plate 36 produces the maximum current.

When the beam is returned to the position in which the beam strikes the target 12 (see FIG. 1), the DC offset generator 39 (see FIG. 4) does not provide any signals to the yoke driver 40. This is accomplished through the timing logic 42 being controlled from the interface (not shown) and the computer (not shown) in the manner more particularly shown and described in the aforesaid U.S. Pat. No. 3,894,271 to Pfeiffer et al.

Thus, each time that the beam is to be applied along the axis 11 and through the aperture 27 to the target 12 (see FIG. 1), it is properly aligned on the axis 11 so that the aperture 27 can be twice as large as the half width of the current density distribution of the source image 26 whereby it is not necessary to rely upon the diameter of the aperture 27 in the blanking plate 28 to center the beam in the projection lens 29.

With the beam aligned on the axis 11 so as to be centered with respect to the projection lens 29, the first demagnification lens 24 creates the magnified image 26 of the source 10 in the plane of the aperture 27 in the blanking plate 28. The magnified image 26 of the source 10 is aligned on the axis 11 because of the correction signals to the alignment yoke 30.

A second demagnification lens 45 magnifies the source image 26 so that it is imaged at center 46 of the projection lens 28. This also defines the half-angle of convergence, which is the angle of the outer line of the ray of the beam from the target 12 with respect to the axis 11.

As shown and described in the aforesaid U.S. Pat. No. 4,243,866 to Pfeiffer et al, a deflection yoke 47 is disposed inside of the projection lens 29. The yoke 47 functions in the manner more particularly shown and described in the aforesaid Kruppa et al patent to deflect the beam over the field of the target 12.

The projection lens 29 also includes a dynamic stigmator 48 and a dynamic focus coil 49 in the manner shown and described in the aforesaid U.S. Pat. No. 4,243,866 to Pfeiffer et al. The dynamic stigmator 48 and the dynamic focus coil 49 cooperate to form standard dynamic elements for correcting field curvature and axial and deflection astigmatism.

Considering the operation of the present invention, the beam is initially manually centered in the projection lens 29 by adjustment of the manual alignment potentiometer 44 (see FIG. 4) of the alignment servo 33. This manual alignment occurs at the time of set up of the apparatus.

Then, as the beam is supplied to the target 12 (see FIG. 1) from the source 10, the alignment servo 33 (see FIG. 4) monitors the alignment of the beam at the sensing aperture 35 at the selected times to provide the necessary correction. This monitoring with corrections is such that it is only necessary to check the alignment of the spot at the start of each day of operation and make manual corrections only every several days or weeks.

An advantage of this invention is that it improves the image quality of the beam. Another advantage of this invention is that it reduces the sensitivity to slight movement of the source image. A further advantage of this invention is that it increases the efficiency of operation. A still further advantage of this invention is that it aligns the beam without an on-axis beam limiting aperture.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. An apparatus for controlling the alignment of a beam of charged particles to a target including:
    a source of charged particles producing a beam of charged particles along an axis for application to a target;
    beam forming means to cause formation of a variable shape of the beam for application to the target;
    aperture means disposed along the axis of the beam in a plane having an image of the source and having a first circular aperture through which the beam passes prior to striking the target, said first aperture having a diameter large enough to not substantially affect the current density distribution of the source image in the plane of said aperture means due to shifting of the source image relative to the axis of the beam;
    aligning means disposed at a reference location off the axis of the beam in the plane of said aperture means to align the beam at selected times;
    and alignment means disposed along the axis of the beam to align the beam solely in accordance with said aligning means.

2. The apparatus according to claim 1 including: said aligning means including:
    sensing means positioned off the axis of the beam to ascertain when the beam is aligned along the axis;
    and causing means to cause deflection of the beam from the axis of the beam to said sensing means at selected times so that the beam is not applied to the target;
    and said alignment means being responsive to said sensing means to align the beam along the axis when the beam is not deflected to said sensing means.

3. The apparatus according to claim 2 in which said sensing means includes:
    a second circular aperture in said aperture means to receive the source image of the beam when the source image of the beam is deflected from the axis of the beam to said sensing means;
    first means to sense the current of the source image of the beam in said second aperture in said aperture means;
    and second means to supply a correction signal to said alignment means until the current of the source image of the beam in said second aperture in said aperture means is a maximum.

4. The apparatus according to claim 3 including:
    lens means to produce an image of said source in a plurality of planes spaced along the axis of the beam;
    and said aperture means being disposed in one of the planes having the source image.

5. The apparatus according to claim 4 in which said aperture means is disposed further from said source than said beam forming means.

6. The apparatus according to claim 5 including said first aperture having a diameter at least twice the half width of the current density distribution of the source image in the plane of said aperture means.

7. The apparatus according to claim 6 including said second aperture having a diameter substantially equal to the half width of the current density distribution of the source image in the plane of said aperture means.

8. The apparatus according to claim 4 including said first aperture having a diameter at least twice the half width of the currrent density distribution of the source image in the plane of said aperture means.

9. The apparatus according to claim 8 including said second aperture having a diameter substantially equal to the half width of the current density distribution of the source image in the plane of said aperture means.

10. The apparatus according to claim 3 including said first aperture having a diameter at least twice the half width of the current density distribution of the source image in the plane of said aperture means.

11. The apparatus according to claim 10 including said second aperture having a diameter substantially equal to the half width of the current density distribution of the source image in the plane of said aperture means.

12. The apparatus according to claim 2 in which said causing means includes means to move the source image of the beam a distance of at least four times the diameter of the beam for blanking of the beam.

13. An apparatus for controlling the alignment of a variable shaped beam of charged particles to a target including:
a source of charged particles producing a beam of charged particles along an axis for application to a target;
variable shaped beam forming means forming a variable shape of the beam for application to the target including:
a first aperture;
a second aperture;
and deflection means between said first aperture and said second aperture, said deflection means deflecting the image of said first aperture relative to said second aperture without having any effect on the source image;
blanking means, disposed along the axis of the beam in a plane having an image of the source, for blocking said beam at selected times and for otherwise permitting said beam to pass therethrough without truncating the current density distribution of the source image in the plane of said blanking means;
aligning means disposed at a reference location off the axis of the beam in the plane of said blanking means for truncating the current density distribution of the source image in the plane of said aligning means whereby the total current passing through said aligning means provides a measure of the beam alignment;
and alignment means disposed along the axis of the beam to align the beam solely in accordance with said aligning means.

14. The apparatus according to claim 13 in which:
said source of charged particles and said beam forming means produce a source image having a predetermined half width of Gaussian current density distribution;
said blanking means includes a first circular aperture along the axis of the beam, said first circular aperture having a diameter at least twice said predetermined half width of Gaussian current density distribution for permitting said beam to pass therethrough without truncating the current density distribution of the source image in the plane of said blanking means;
and said aligning means includes a second circular aperture having a diameter substantially equal to said predetermined half width of Gaussian current density distribution for truncating the current density distribution of the source image in the plane of said aligning means.

15. The apparatus according to claim 14 including:
said aligning means including:
sensing means positioned off the axis of the beam to ascertain when the beam is aligned along the axis;
and causing means to cause deflection of the beam from the axis of the beam to said sensing means at selected times so that the beam is not applied to the target;
and said alignment means being responsive to said sensing means to align the beam along the axis when the beam is not deflected to said sensing means.

16. The apparatus according to claim 15 in which said sensing means includes:
first means to sense the current of the source image of the beam in said second circular aperture;
and second means to supply a correction signal to said alignment means until the current of the source image of the beam in said second circular aperture is a maximum.

17. The apparatus according to claim 16 including lens means to produce an image of said source in a plurality of planes spaced along the axis of the beam.

18. The apparatus according to claim 13 including lens means to produce an image of said source in a plurality of planes spaced along the axis of the beam.

* * * * *